(12) United States Patent
Tellkamp et al.

(10) Patent No.: US 12,293,953 B2
(45) Date of Patent: May 6, 2025

(54) EDGE BEND FOR ISOLATION PACKAGES

(71) Applicant: TEXAS INSTRUMENTS INCORPORATED, Dallas, TX (US)

(72) Inventors: John Paul Tellkamp, Rockwall, TX (US); Chang-Yen Ko, Taipei (TW)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/709,497

(22) Filed: Dec. 10, 2019

(65) Prior Publication Data

US 2020/0118899 A1    Apr. 16, 2020

Related U.S. Application Data

(63) Continuation of application No. 16/028,179, filed on Jul. 5, 2018, now abandoned.

(60) Provisional application No. 62/571,091, filed on Oct. 11, 2017.

(51) Int. Cl.
*H01L 23/31*        (2006.01)
*H01L 23/495*       (2006.01)

(52) U.S. Cl.
CPC ...... *H01L 23/3114* (2013.01); *H01L 23/3107* (2013.01); *H01L 23/49503* (2013.01); *H01L 23/49551* (2013.01); *H01L 23/49555* (2013.01); *H01L 23/49575* (2013.01); *H01L 2224/05554* (2013.01); *H01L 2224/48137* (2013.01); *H01L 2224/48247* (2013.01); *H01L 2224/49171* (2013.01)

(58) Field of Classification Search
None
See application file for complete search history.

(56) References Cited

U.S. PATENT DOCUMENTS

| 5,312,674 | A | 5/1994 | Haertling et al. |
| 5,420,558 | A | 5/1995 | Ito et al. |
| 8,008,758 | B1 * | 8/2011 | Kim ...................... H01L 25/105 |
| | | | 257/E23.047 |
| 2002/0074627 | A1 * | 6/2002 | Combs .............. H01L 23/49541 |
| | | | 257/666 |
| 2005/0128038 | A1 | 6/2005 | Hyvonen |

(Continued)

OTHER PUBLICATIONS

M. Acanski, J. Popovic-Gerber, B. Ferreira, "Design of a Flexible Very Low Profile High Step-Up PV Module Integrated Converter." 2012 IEEE Energy Conversion Congress and Exposition, pp. 2942-2948.

(Continued)

*Primary Examiner* — Peniel M Gumedzoe
(74) *Attorney, Agent, or Firm* — Dawn Jos; Frank D. Cimino (57) ABSTRACT

A semiconductor isolation package includes a leadframe that includes a plurality of leadframe leads. At least one of the plurality of leadframe leads includes a lead body having a first end that comprises an external pin portion and a second end. The lead body has a leg portion coupled to a central lead portion that is coupled to an edge bend portion. The edge bend portion is formed by a first bend on the lead body proximate the second end between the central lead portion and edge bend portion. The first bend is in the direction of the first end on the leg portion. The edge bend assists in shielding electronic fields. Other aspects are presented.

20 Claims, 5 Drawing Sheets

(56) References Cited

U.S. PATENT DOCUMENTS

| | | | |
|---|---|---|---|
| 2008/0087992 A1 | 4/2008 | Shi et al. | |
| 2008/0157401 A1* | 7/2008 | Kim | H01L 23/49575 257/787 |
| 2008/0265386 A1* | 10/2008 | Muto | H01L 23/49562 257/676 |
| 2009/0243782 A1 | 10/2009 | Fouquet et al. | |
| 2010/0148911 A1 | 6/2010 | Fouguet et al. | |
| 2010/0259909 A1 | 10/2010 | Ho et al. | |
| 2010/0265030 A1 | 10/2010 | Weekamp et al. | |
| 2011/0057291 A1 | 3/2011 | Slupsky et al. | |
| 2011/0095620 A1 | 4/2011 | Fouquet et al. | |
| 2012/0020419 A1 | 1/2012 | Kaeriyama | |
| 2012/0168901 A1 | 7/2012 | Santangelo et al. | |
| 2012/0175756 A1* | 7/2012 | Kim | H01L 23/49575 257/676 |
| 2013/0043970 A1 | 2/2013 | Poddar et al. | |
| 2013/0082812 A1 | 4/2013 | Yoo et al. | |
| 2014/0002935 A1* | 1/2014 | Chen | H01L 23/3185 361/56 |
| 2014/0252533 A1 | 9/2014 | O'Sullivan | |
| 2015/0069572 A1 | 3/2015 | Khanolkar et al. | |
| 2015/0108603 A1 | 4/2015 | Yen et al. | |
| 2015/0115402 A1 | 4/2015 | Yen et al. | |
| 2015/0200162 A1* | 7/2015 | Constantino | H01L 23/49537 257/532 |
| 2017/0178787 A1* | 6/2017 | Massolini | H01F 41/0206 |
| 2018/0306843 A1* | 10/2018 | Bussing | G01R 15/207 |

OTHER PUBLICATIONS

Bang, D.H., and J.Y. Park. "Ni—Zn Ferrite Screen Printed Power Inductors for Compact DC-DC Power Converter Applications." vol. 45, No. 6, Jun. 2009, IEEE Transactions on Magnetics: 2762-65.

Hurley, W.G, M.C. Duffy, S. O'Reilly, and S.C. O'Mathuna. "Impedance Formulas for Planar Magnetic Structures with Spiral Windings." vol. 46, No. 2, Apr. 2009, IEEE Transactions on Industrial Electronics: 271-78.

Lu, Junwei, and F. Dawson. "Characterizations of High Frequency Planar Transformer With a Novel Comb-Shaped Shield." vol. 47, No. 10, Oct. 2011, IEEE Transactions on Magnetics: 4493-496.

Liu, X., and S.Y. R. Hui. "An Analysis of a Double-layer Electromagnetic Shield for a Universal Contactless Battery Charging Platform." IEEE 36th Conference on Power Electronics Specialists, 2005, pp. 1767-1772.

Ouyang, Z. and M. Andersen "Overview of Planar Magnetic Technology—Fundamental Properties." vol. 29, No. 9, Sep. 2014, IEEE Transactions on Power Electronics: 4888-4900.

Roshen, W.A. "Analysis of Planar Sandwich Inductors by Current Images." vol. 26, No. 5, Sep. 1990, IEEE Transactions on Magnetics: 2880-87.

Tang, S.C., S. Y. Ron Hui and H. Shu-Hung Chung. "A Low-Profile Power Converter Using Printed-Circuit Board (PCB) Power Transformer with Ferrite Polymer Composite." vol. 16, No. 4, Jul. 2001, IEEE Transactions on Power Electronics: 493-98.

Tang, S.C., S. Y. Ron Hui, and H. Shu-Hung Chung. "Evaluation of the Shielding Effects on Printed-Circuit-Board Transformers Using Ferrite Plates and Copper Sheets." vol. 17, No. 6, Nov. 2002, IEEE Transactions on Power Electronics: 1080-88.

Chen, Baoxing et al., "High Speed Digital Isolators Using Microscale On-Chip Transformers", 72203-12709274, Non-Patent Literature, May 18, 2010 (Year 2010).

* cited by examiner

EDGE BEND FOR ISOLATION PACKAGES

CROSS-REFERENCE TO RELATED APPLICATION

This application is a continuation of patent application Ser. No. 16/028,179, filed Jul. 5, 2018, which claims the benefit of and priority to Provisional Application No. 62/571,091, filed Oct. 11, 2017, which is hereby fully incorporated herein by reference for all purposes.

TECHNICAL FIELD

This relates generally to semiconductor devices, and more particularly semiconductor isolation packages.

BACKGROUND

Semiconductor devices are used in many applications. In some instances, a semiconductor isolation device is used to provide isolation of a human user or equipment from a high voltage spike. These isolation devices have two main failure modes: package failure or component failure. The more common failure mode in some instances is package failure. The isolation devices are tested to demonstrate a certain voltage rating without arc failure.

SUMMARY

In one aspect, a semiconductor isolation package includes a leadframe that includes a plurality of leadframe leads. At least one of the plurality of leadframe leads includes a lead body having a first end that comprises an external pin portion and a second end, and wherein the lead body has a leg portion coupled to a central lead portion that is coupled to an edge bend portion. The edge bend portion is formed by a first bend on the lead body proximate the second end between the central lead portion and edge bend portion. The first bend is in the direction of the first end on the leg portion.

According to an aspect, an isolation semiconductor package includes a leadframe that includes a plurality of leadframe leads having a first end and a second end. The first end comprises an external pin portion. At least one of the leadframe leads of the plurality of leadframe leads includes a lead body having a leg portion coupled to a central lead portion coupled to edge bend portion, and wherein a first bend is formed between the central lead portion and the edge bend portion. The first bend is formed in the direction of the first end. The isolation semiconductor package also includes a first die pad, which is a downset die pad, coupled to at least one of the plurality of leadframe leads. The central lead portion of the at least one of the leadframe leads of the plurality of leadframe leads extends along a first plane in a first direction and the first die pad is at least partially in a second plane that is parallel to the first plane. The first plane is displaced from the second plane in a second direction that is orthogonal to the first direction and is displaced towards the first end of the plurality of leadframe leads. The isolation semiconductor package also includes a component coupled to the first die pad and a mold compound substantially covering the first die pad, the component, and at least the edge bend portion of the at least one of the leadframe leads of the plurality of leads.

According to an aspect, a semiconductor isolation package includes a leadframe, and the leadframe includes a plurality of leadframe leads including a first end that forms an external pin portion and a second end. Each of the plurality of leadframe leads includes a lead body having a leg portion proximate the first end and coupled to a central lead portion that is coupled to an end portion at the second end. At least some of the plurality leadframe leads include a first internal edge on the second end and at least some of the plurality of leadframe leads include a second internal edge on the second end and that is opposed to the first internal edge. The semiconductor isolation package further includes a downset die pad positioned between the first internal edge and the second internal edge. Wherein the downset die pad is displaced from the second end of the plurality of leadframe leads in a direction towards the first end of the plurality leadframe leads. At least one of the plurality of leadframe leads is formed with a bend between the central lead portion and the end portion to form an edge bend. The bend is in a same direction as the second plane is displaced from the first plane. Other aspects are disclosed herein.

DETAILED DESCRIPTION

With respect to semiconductor isolation devices that are meant to protect a human user or a piece of equipment, it is desirable to minimize package failure. Package failure occurs when an arc occurs across the package. For a package under electrical stress, an electrical field develops on an interior of the package and can grow and extend outside the package. When that happens the electrical field outside is more likely to ionize air or the exterior gas or gases and increases the chances of an arc.

In one aspect, arc-failure of an isolation package is decreased by a leadframe that reduces the external electrical field that develops by containing the electrical field in the package. The electrical field is contained by shielding the area toward the closest or nearby leads by bending down an internal edge portion of the leads. The leads are bent towards the ends of the external pins and towards a downset die pad.

Figure 1A:
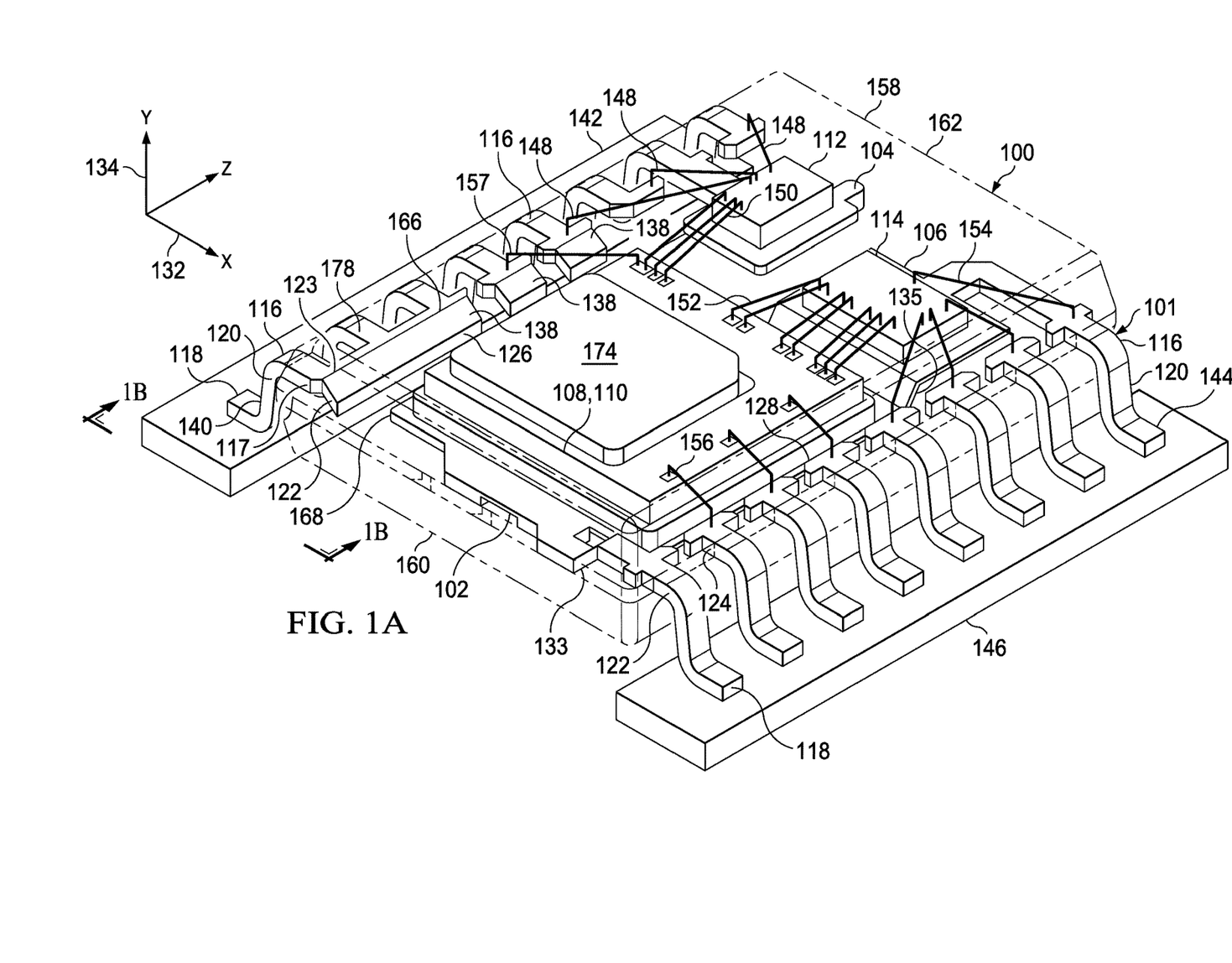
FIG. 1A is a schematic, perspective view of a semiconductor isolation package, according to an illustrative arrangement.
Figure 1B:
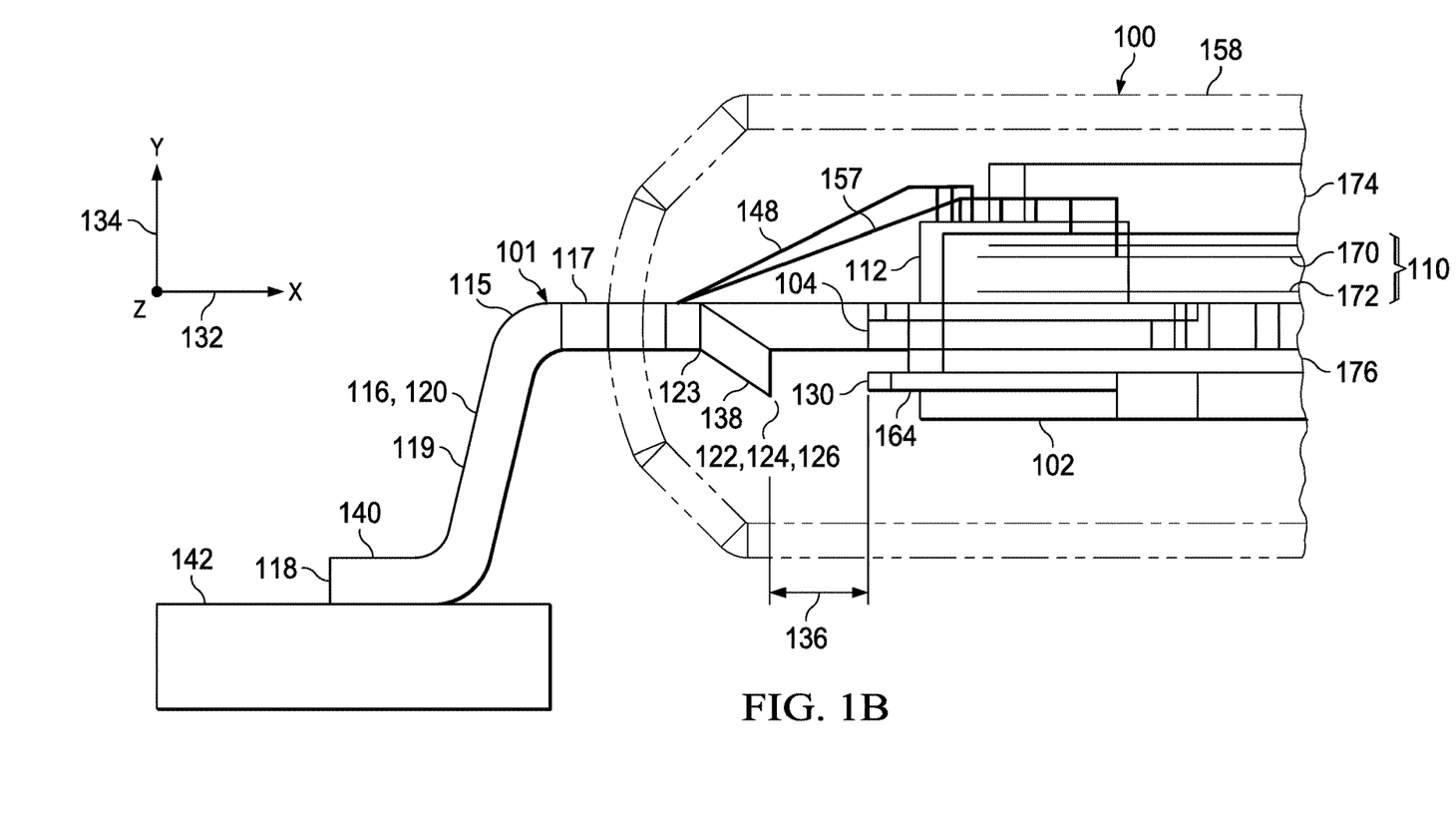
FIG. 1B is a side elevation cross sectional view of a portion of the semiconductor isolation package of FIG. 1A.

Referring now to the drawings, and initially and primarily to FIGS. 1A-1B, an illustrative semiconductor isolation package 100 is shown in perspective view. The semiconductor isolation package 100 includes a leadframe 101 having a first die pad 102, which is a downset die pad, a second die pad 104, and third die pad 106. A component 108 is coupled to the first die pad 102. In this instance, the component 108 is a transformer 110. A first die 112 is coupled to the second die pad 104, and a second die 114 is coupled to the third die pad 106.

A plurality of leadframe leads 116 include a first end 118 that comprises an external pin portion and a second end 122 that comprises an edge portion 124, or inner edge or internal edge. The edge portion 124 is the end of the lead 116 that is closest to one or more die pads (e.g., die pad 102). As used herein, "plurality" means two or more. At least some of the plurality leadframe leads 116 make up a first internal edge 126 and at least some of the plurality of leadframe leads 116 make up a second, opposed internal edge 128. The die pads 102, 104, and 106 are disposed between the first internal edge 126 and the second internal edge 128. In terms of arc-failure, the location of greatest concern is where the smallest gap (compared to other gaps in the package) is formed between leadframe leads 116 and components that have the greatest potential difference, and in this illustrative arrangement, it will be appreciated that an external edge 130 (FIG. 1B) of the first die pad 102 is closest to the first internal edge 126 at the second end 122. The first die pad 102, which is a downset die pad, is positioned or offset closer to the first internal edge 126. The internal edge 128 of the lead forming the second internal edge 128 is electrically coupled to die pad 102 and conductor 146 so that there is no electrical potential difference between these edges.

At least one 115 of the plurality of leadframe leads 116 includes a lead body 117 having and extending between the first end 118 and the second send 122. The first end 118 forms an external pin portion. The lead body 117 has a leg portion 119 coupled to a central lead portion 120 that is coupled to the edge bend portion 138. The edge bend portion 138 is formed by a first bend 123 on the lead body 117 proximate the second end 122 between the central lead portion 121 and edge bend portion 138. The first bend 123 is in the direction of the first end 118, e.g., down in the orientation of FIG. 1B, on the leg portion 119. The edge bend portion 138 assists in shielding an electrical field as described elsewhere herein.

The edge portion 124 of the plurality of leadframe leads 116 that form the first internal edge 126 is coupled to the central lead portion 120 is in a first plane (see by analogy plane 220 in FIG. 2) extending in a first direction 132 and wherein the first die pad 102 is in a second plane (see by analogy plane 228 in FIG. 2) parallel to the first plane and extending in the first direction 132 and displaced in a second direction 134 towards the first end 118 of the plurality of leadframe leads 116. Thus, for the orientation of FIGS. 1A-1B, the first die pad 102 extends downwardly, the first end of the plurality of leadframes 116 extends downwardly, and, as will be explained below, the edge bend portion 138 also extends downwardly. The first die pad 102 is downset by downsets 133 and 135.

The area generally indicated 136 in FIG. 1B is where an electric field will begin to center and grow during a high voltage scenario, and for that reason, the edge bend portion 138 has been formed at the second end 122 of at least a number of the leadframe leads 116 in the area 136. The edge bend portion 138 shields or blocks the electric field from moving out of the package and toward the first end 118 of the leadframes 116. This is further clarified by comparing FIGS. 3 and 4 that are discussed further below. The second end 122 of at least some of the plurality of leadframe leads 116 that form the first internal edge 126 have the edge bend portion 138 that extends in a direction going from the central lead portion 120, which extends along the first plane (see 220 in FIG. 2), towards the second plane (see 228 in FIG. 2). The edge bend portion 138 is formed with the bend 123 made in the range of 20-300 micrometers from the second end 122 and in another arrangement in the range of 150-300 micrometers from the second end 122. In one illustrative arrangement, the bend 123 of the edge bend portion 138 is formed at least 35 micrometers from the edge portion 124.

The first ends 118 of the plurality of leadframe leads 116 on a first lateral side 140, which is shown clearly in FIG. 1B and are the same side as the first internal edge 126, are electrically coupled to a first test conductor 142 or, if individual sites, land pads. Likewise, the first ends 118 of the plurality of leadframe leads 116 on a second lateral side 144, which includes the second internal edge 128, are electrically coupled to a second test conductor 146 or, if individual sites, land pads.

In this illustrative example, bond wires 148 interconnect the first die 112 with some of the plurality of leadframe leads on the first lateral side 140. Bond wires 150 interconnect the first die 112 and the component 108. Bond wires 152 interconnect the second die 114 and the component 108. Bond wires 154 interconnect the second die 114 and some of the plurality of leadframe leads 116 on the second lateral side 144. Bond wires 156 interconnect the component 108 and some of the plurality of leadframe leads 116 on the second lateral side 144. Bond wires 157 interconnect the component 108 and some of the plurality of leadframe leads 116 on the first lateral side 140.

The semiconductor isolation package 100 includes a mold compound 158 that in a completed state covers at partially the die pad 102, the component 108, and at least the edge bend portion 138 of at least one of the leadframe leads. The semiconductor isolation package 100 has the first lateral side 140 and opposing second lateral side 144, and has a first longitudinal side 160 and an opposing second longitudinal side 162.

In some arrangements, the external or outward-facing edge 130 of the downset die pad 102 may be formed with a stepped portion 164 (FIG. 1B) at the edge 130; that is, half the thickness or some percentage of the thickness may be removed. In one illustrative example, the stepped portion has a thickness on the external edge that has been reduced by at least 30%. In some arrangements, the stepped portion 164 may be a half-etch. The stepped portion 164 is a feature that helps pull the electrical field up (for the orientation shown) a bit and makes a higher field with a smaller volume and that is better for reducing the arc-failure risk of the package 100.

While other components 108 might be used, the semiconductor isolation package 100 is shown with the component 108 in the form of the transformer 110. As shown clearly in FIG. 1B, the transformer 110 includes a first coil 170 that is displaced from a second coil 172. A first magnetic member 174 is placed and glued or otherwise attached at the top (further in the second or y-direction 134) for the orientation shown of the transformer 110 and a second magnetic member 176 is placed and glued or otherwise attached at the bottom for the orientation shown (further down in the y-direction 134). The magnetic members 174, 176 may be ferrite members. The transformer 110 is more efficient when larger, and accordingly, the larger size makes the gap discussed herein smaller. The edge bend 138 assists with accommodating the larger size without compromising the rating of the semiconductor isolation package 100.

FIG. 1A shows the edge bend 138 associated with five leadframe leads, but it should be understood that the edge bend 138 could have fewer or more leads involved. Only five were used in this arrangement because the five leadframe leads are the closest—forms the smallest gap—between the leadframe leads and the downset die. It will be appreciated then that at least some of the plurality of leadframe leads 116 that include the edge bend portion 138 include a leadframe lead 178 that is closest to the downset die pad 102.

Figure 2:
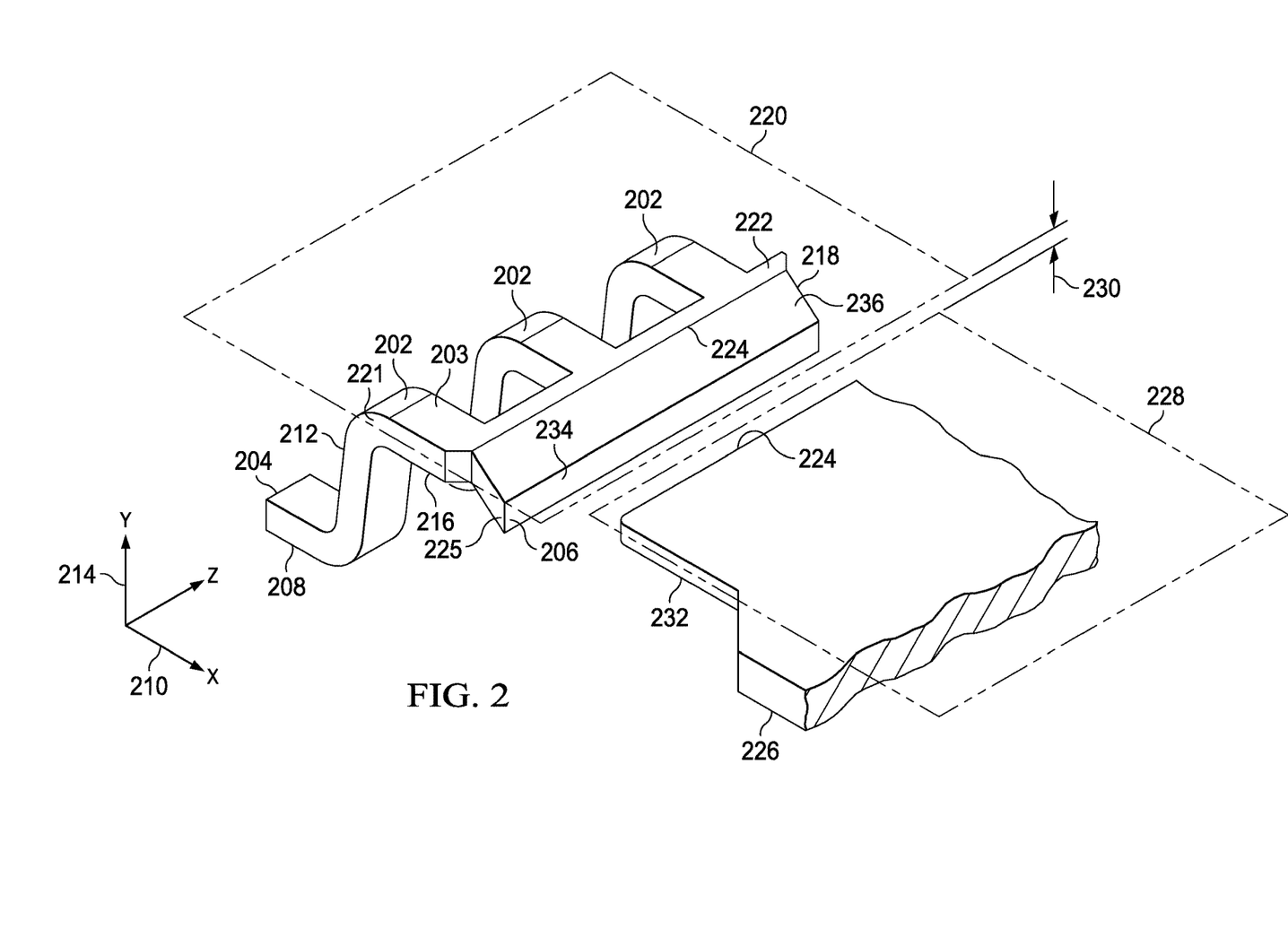
FIG. 2 is a schematic, perspective view of a plurality of leadframe leads of a semiconductor isolation package, according to an illustrative arrangement.

Referring now primarily to FIG. 2, a portion of a leadframe 200 for use with semiconductor isolation packages is presented in a perspective view. The portion shown corresponds with aspects of the illustrative semiconductor isolation package 100 of FIG. 1A and more particularly with portions proximate the first lateral side 140 and the first longitudinal side 160, namely with portions 166 and 168 from FIG. 1A.

The leadframe 200 includes a plurality of leadframe leads 202 that each have a first end 204 and a second end 206 of a lead body 203. In this instance each leadframe lead 202 has a leg portion 212 that has a foot portion 208 at the first end 204. The foot portion 208 extends generally in the x-direction 210 for the orientation shown. A majority of the leg portion 212 extends generally in the y-direction 214—generally upward for the orientation shown. The leg portion 212 transitions to a central lead portion 216 that is again primarily in the x-direction 210 until reaching a bend 224. A bend 221 transitions the lead body 203 from the leg portion 212 to the central lead portion 216. At the bend 224, the central lead portion 216 transitions to an end portion 225. That is, proximate leading edge 234, the bend 224 in the lead body 203 forms the edge bend 218.

The edge bend 218 is formed at the second end 206 and angles down (for the orientation shown). The central lead portion 216 is largely (a majority in this embodiment) coplanar with a first reference plane 220 and the edge bend 218 extends away from the reference plane 220. In this illustrative arrangement, the central lead portion 216 forms a unified plank member 222 that has the bend 224 of between about 20 and 60 degrees from the first plane 220 to form the edge bend 218. The angle may be determined using another reference as described in connection with FIG. 3 further below.

The edge bend 218 extends downwardly and may include a unified plank 224. The bend 224 is from an end of the central lead portion 216 that is in the first plane 220 towards an outer edge 224 of a downset die pad 226. A substantial or majority of a planar portion of the downset die pad 226 is partially coplanar with a second plane 228. The second plane 228 is displaced by a dimension 230 from the first plane 220 in the y-direction 214. The displacement represented by dimension 230 may vary for different applications, but in one instance is between 200 and 400 microns. In one illustrative arrangement, the displacement 230 is 75 microns. The edge 224 of the downset die pad 226 may be formed with a stepped, or inverted stepped, portion 232. The stepped portion may be formed by reducing the thickness of the die pad 226 on the edge 224.

While only a portion of the leadframe 200 is shown, it should be understood that the gap between the leading edge 234 of the edge bend 218 and the edge 224 of the downset die pad 226 represents the smallest gap of the associated package and, thus, the likely location for an electrical field to develop when a package with the leadframe 200 is under high voltage. A planar base 236 or surface of the edge bend 218 shields the foot portion 208 of the leg portion 212 of the nearby leadframe leads 202 and thereby may prevent an electric field from forming outside of a mold compound (see 158 in FIG. 1A).

Figure 3:
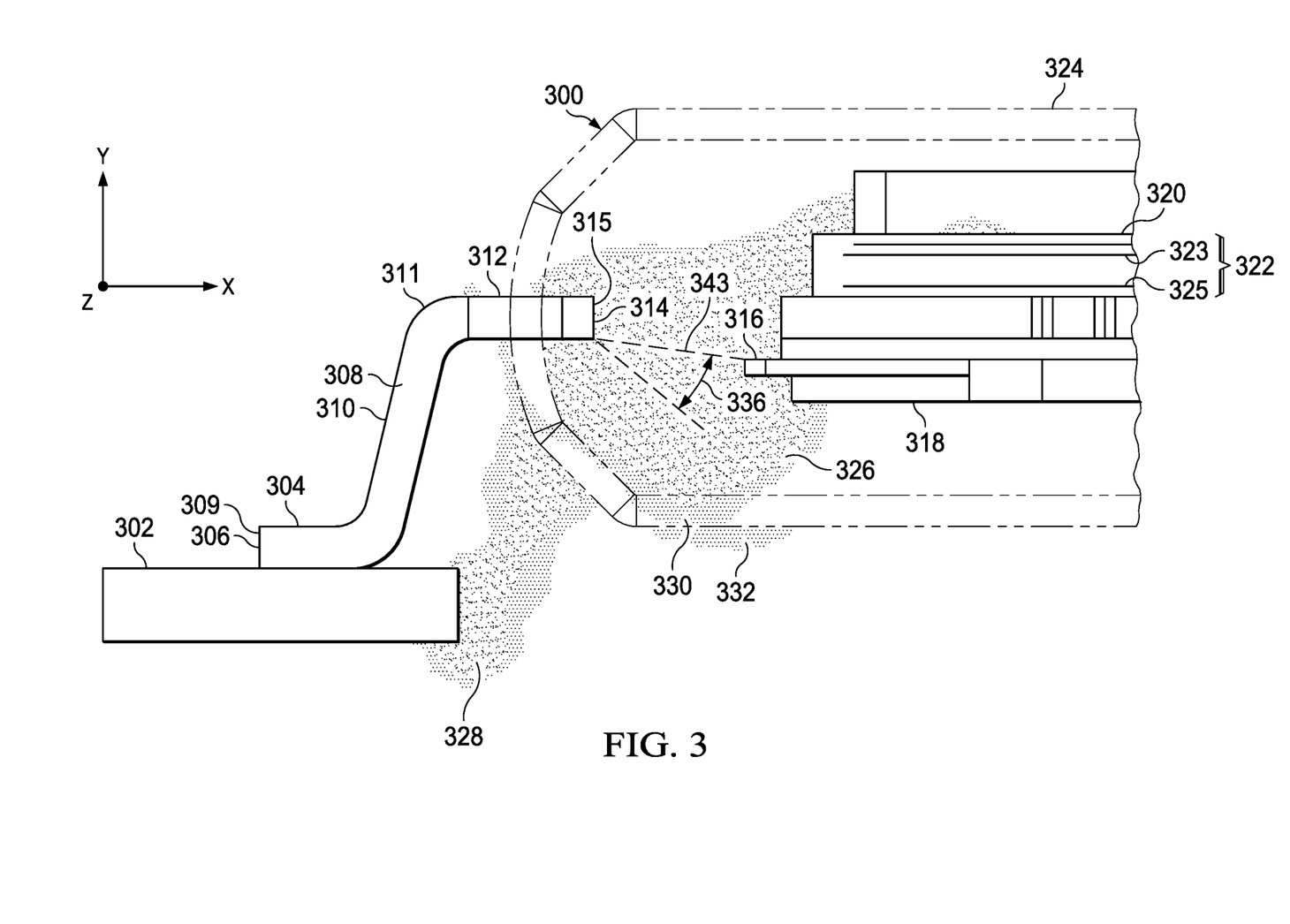
FIG. 3 is a side elevation cross sectional view of a portion of a semiconductor isolation package showing qualitatively the presence of an electrical field when the semiconductor isolation package is undergoing a test.
Figure 4:
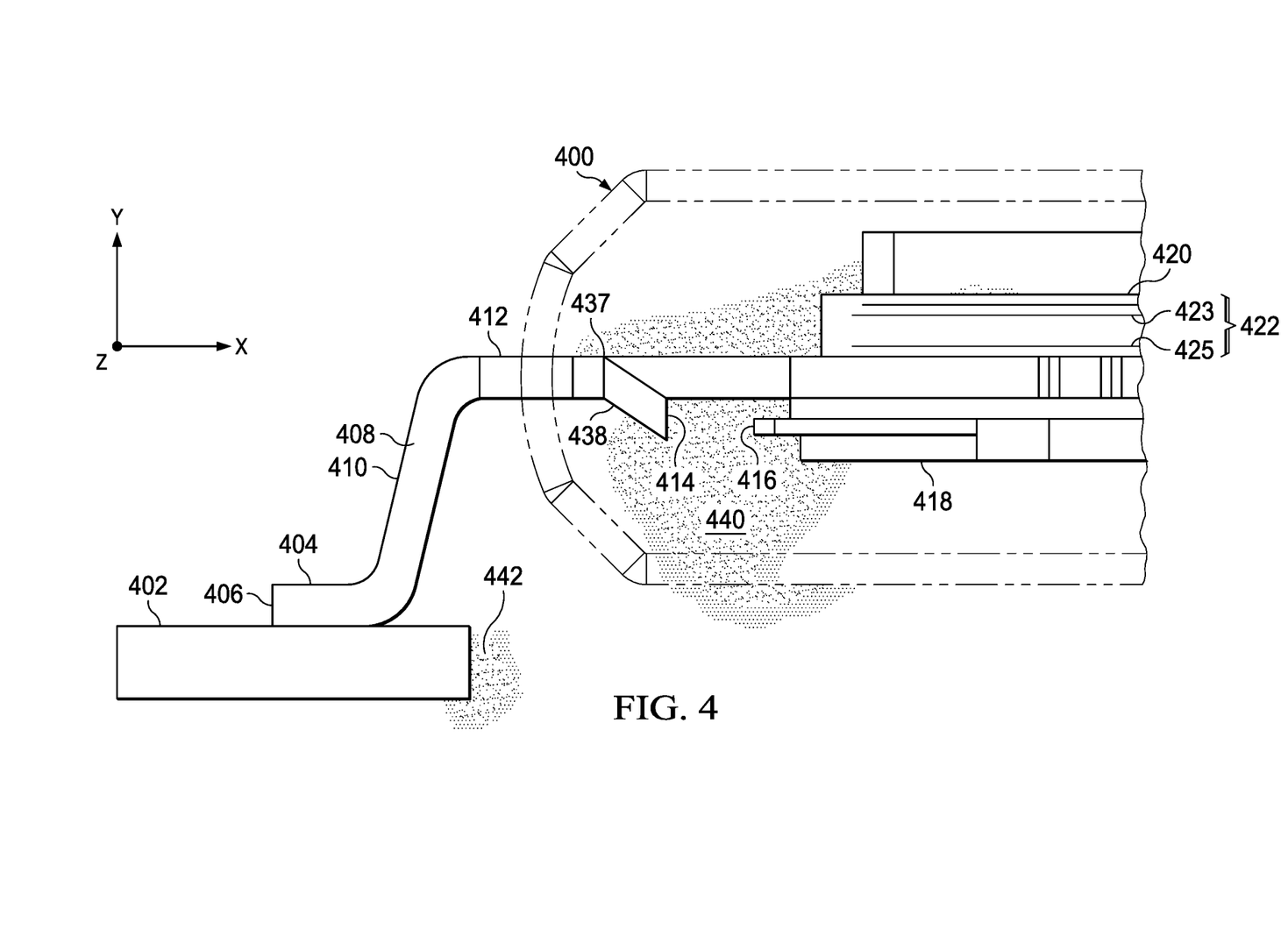
FIG. 4 is a side elevation cross sectional view of a portion of a semiconductor isolation package having an illustrative edge bend portion and showing qualitatively the presence of an electrical field when the semiconductor isolation package is undergoing a test.

A qualitative discussion of performance vis-à-vis an electrical field of an illustrative arrangement of a semiconductor isolation package 400 will now be presented in connection with FIGS. 3 and 4. Referring initially to FIG. 3, a portion of the semiconductor isolation package 300 is shown in cross section and for reference without an edge bend (see 218 in FIG. 2) but the edge bend will be shown in FIG. 4. The semiconductor isolation package 300 is analogous in most respects to those of FIGS. 1-2 and corresponds with aspects of the illustrative semiconductor isolation package 100 of FIG. 1A, and more particularly, with portions proximate the first lateral side 140 and first longitudinal side of the 160. Because the semiconductor isolation package 300 is analogous in most respects, all the details are not described again.

FIG. 3 shows a tester contactor 302 on one lateral side 304 of the semiconductor isolation package 300. A foot portion 306 or land pad of a leadframe lead 308 at a first end 309 is shown on the tester contactor 302. The leadframe lead 308, which is a plurality in a row, has leg portion 310 and a central lead portion 312 with a bend 311 therebetween. Unlike other figures, the central lead portion 312 does not have second bend transitioning to an edge bend. Thus an internal edge 314 on second end 315 is across and above an edge 316 of a downset die pad 318.

The downset die pad 318 has a component 320 that is a transformer 322. The transformer 322 has a first coil 323 and a second coil 325. A mold compound 324 is over molded to form an exterior of the package or cover at least a portion of the components therein. In the arrangement of FIG. 3, which is meant to show qualitative results based on modeling results, the most concentrated electrical field 326 descends down toward the tester contactor 302 with a portion 328 formed outside the package 300. The portion 328 outside may ionize the air and make an arc failure more likely. This view also shows that the lower portion 330 forms a larger portion 332 when outside the package because the dielectric of air is less. This arrangement is mainly presented for contrast with the benefits of adding an edge bend, but it also facilitates another way to view the angle of the edge bend as will now be described.

If a reference line 343 is drawn from the closest two portions between the internal edge 314 of the leadframe and the edge 316 of the downset die 318, that reference line 343 is one that may be used to describe an angle 336 between the reference line 334 and the edge bend 438 (as shown in FIG. 4). Said another way, the reference line 334 forms a shortest line from the second end 315 or internal edge 314 of the plurality of leadframes when positioned without a bend to a closest point of the external edge 316 of the downset die pad 318. The angle 336 is between 30 and 50 degrees in one arrangement. The angle 336 is between 40 and 50 degrees in another arrangement. The angle 336 is 45 degrees in still another arrangement.

Referring now primarily to FIG. 4, a semiconductor isolation package 400 (analogous to isolation package 300 of FIG. 3) is presented with two main changes: a bend 437 has been added to form an edge bend 438 and the resultant electrical field is different. Now when the high voltage is applied across the semiconductor isolation package 400, the strongest electrical field 440 is at least partially blocked, shielded, or otherwise influenced by the edge bend 438. The edge bend 438 keeps the electrical field 440 more centrally located and higher up away from the contactor 402 or foot portion 406 of the leadframe lead 408. While an electrical field 442 is shown on an end of the tester contactor 402, the electrical field 442 is small by comparison and does not extend from the package 400 itself to that point. This qualitative presentation is meant to show what is believed to be the reason the edge bend 438 assists in reducing arc-failure of the package 400.

Referring again primarily to FIG. 2, in one embodiment, the lead 202 may be part of any semiconductor package that has a central lead portion 216 that extends substantially in the reference plane 220 and then bends at bend 224 downward for orientation shown (same general direction as the leg portion 212) and extends away from the central lead portion 216 to form the edge bend 218. In one example the leg portion 212 may be a gull wing on a quad flat package (QFP) or other package and the central lead portion 216 extends in a plane (see, e.g., plane 220) and then bends (see bend 224) in the same direction (down for orientation of FIG. 2).

Continuing to refer primarily to FIG. 2 and with an alternative presentation, at least one lead 202 of a semiconductor package has a first end 204 that forms an external pin portion 212 and a second end 206 that forms an inner edge portion 234. A central lead portion 216 extends between the external pin portion 212 and an edge bend 218, which is formed proximate the second end 206. The external pin portion 212, central lead portion 216, and edge bend 218 are all primarily in different planes. A bend 224 formed between the edge bend 218 and the central lead portion 216 is formed with an angle between 20 and 60 degrees in the same direction as towards the external pin portion 212. In another arrangement, the angle is between 30 and 50 degrees. In another arrangement the angle is 45 degrees. A "bend" is where a portion has been forced or formed to go from straight to curved or angular, or to go from one degree of curved to distinctly more curved.

In one arrangement, a semiconductor package comprises a leadframe and the lead frame includes at least one lead having a first end that forms an external pin portion and a second end, and further having a central lead portion that extends between the external pin portion and an edge bend. The edge bend is formed proximate the second end. The central lead portion and the edge bend are primarily in different planes. A bend is formed between the edge bend and the central lead portion that is in the same direction as towards the external pin portion (e.g., downward for orientation of the figures herein).

In an alternative arrangement to those previously presented, the edge bend is bent away from the leg portion (opposite direction from shown in FIGS. 1-2) to pull the electrical field upward.

Modifications are possible in the described arrangements, and other arrangements are possible, within the scope of the claims. It should be understood that while certain semiconductor package types are shown herein for illustration purposes, the disclosure contemplates other semiconductor package types as well.

What is claimed is:

1. A semiconductor package comprising:
a first die pad;
an electronic component, attached to the first die pad, and electrically connected to at least a first lead, and electrically isolated from a second lead; and
mold compound covering portions of the first die pad and the electronic component, wherein the second lead includes:
a first end portion covered by the mold compound, and at least two first internal portions covered by the mold compound, and at least two second end portions external to the mold compound; wherein a plane along a surface of the first end portion is at an angle with respect to a plane along a surface of the first die pad; and wherein the first end portion is free standing within the semiconductor package supported by the mold compound.

2. The semiconductor package of claim 1, wherein the plane along a surface of the first die pad is below the plane along a surface of the at least first internal portions.

3. The semiconductor package of claim 1, wherein the electronic component is a transformer.

4. The semiconductor package of claim 3 further comprising a magnetic member attached to the transformer.

5. The semiconductor package of claim 4, wherein the transformer includes a plurality of coils parallel to each other, within the transformer.

6. The semiconductor package of claim 1 further comprising a second die attached to a second die pad and electrically connected to one of the first lead and the electronic component.

7. The semiconductor package of claim 6, wherein a plane along a surface of the second die pad is below a plane along a surface of the at least two first internal portions.

8. The semiconductor package of claim 1, wherein the angle is between 20 and 60 degrees.

9. The semiconductor package of claim 1, wherein the second lead and the first lead are adjacent to and separated from the first die pad.

10. The semiconductor package of claim 1, wherein the semiconductor package functions as an isolation device.

11. The semiconductor package of claim 1, wherein the at least two first internal portions are within the mold compound.

12. A semiconductor package comprising:
a first die pad;
an electronic component, attached to the first die pad, and electrically isolated from a first lead;
mold compound covering portions of the first die pad and the electronic component, wherein the first lead is physically detached from the first die pad, and wherein the first lead includes:
a first end portion covered by the mold compound, and at least two first internal portions covered by the mold compound, and at least two second end portions external to the mold compound; wherein a plane along a surface of the first end portion is at an angle with respect to a plane along a surface of the first die pad; and wherein the first end portion is free standing within the semiconductor package supported by the mold compound.

13. The semiconductor package of claim 12 further comprising a second die attached to a second die pad, and electrically connected to at least one of a plurality of leads.

14. The semiconductor package of claim 13, wherein the plane along a surface of the first die pad is below a plane along a surface of the at least two first internal portions.

15. The semiconductor package of claim 12, wherein the component comprises a transformer including a laminate.

16. The semiconductor package of claim 12, wherein the at least two first internal portions are within the mold compound.

17. A semiconductor package comprising:
a transformer attached to a first die pad;
a first die attached to a second die pad;
a second die attached to a third die pad; the transformer, first die and second die electrically connected to a plurality of leads; and
molding compound covering portions of the transformer, the first die, the second die, and a metal member; the metal member adjacent to the first die pad and physically detached from the first die pad, the metal member including a first end portion and at least two first internal portions, both covered by the molding compound, and at least two second end portions, wherein a plane along a surface of the first end portion is at an angle with respect to a plane along a surface of the first die pad.

18. The semiconductor package of claim 17, wherein the at least two second end portions are external to the mold compound.

19. The semiconductor package of claim 17, wherein the metal member is electrically isolated from the transformer, the first die, and the second die.

20. The semiconductor package of claim 17, wherein the metal member is electrically connected to the transformer.

* * * * *